United States Patent [19]

Drake et al.

[11] Patent Number: 5,015,880

[45] Date of Patent: May 14, 1991

[54] CMOS DRIVER CIRCUIT

[75] Inventors: Charles E. Drake, Underhill; Howard L. Kalter, Colchester; Scott C. Lewis, Essex Junction, all of Vt.

[73] Assignee: International Business Machines Corporation, Armonk, N.Y.

[21] Appl. No.: 419,341

[22] Filed: Oct. 10, 1989

[51] Int. Cl.[5] .................. H03K 17/16; H03K 19/20; H03K 5/13
[52] U.S. Cl. .................. 307/443; 307/451; 307/594; 307/263; 307/270
[58] Field of Search ............ 307/451, 443, 246, 263, 307/270, 594; 323/284

[56] References Cited

U.S. PATENT DOCUMENTS

| | | | |
|---|---|---|---|
| 4,542,307 | 9/1985 | Baba | 307/270 |
| 4,567,378 | 1/1986 | Raver | 307/270 |
| 4,612,466 | 9/1986 | Stewart | 307/585 |
| 4,638,187 | 1/1987 | Boler et al. | 307/451 |
| 4,782,250 | 11/1988 | Adams et al. | 307/270 |
| 4,795,917 | 1/1989 | Scott et al. | 307/270 |
| 4,829,199 | 5/1989 | Prater | 307/451 |
| 4,868,422 | 9/1989 | Daniele et al. | 307/451 |
| 4,877,980 | 10/1989 | Kubinec | 307/451 |
| 4,890,010 | 12/1989 | Neudeck et al. | 307/270 |

*Primary Examiner*—Stanley D. Miller
*Assistant Examiner*—Toan Tran
*Attorney, Agent, or Firm*—Calfee, Halter & Griswold

[57] ABSTRACT

A CMOS integrated circuit for driving capacitance devices is provided. The circuit has an input node and an output node and includes a first transistor operatively connected to the input node which is turned "on" and "off" by the input node to supply an output signal to the output node when turned "on". A second transistor is provided, the output of which is connected to the output node when turned "on" to supply an output signal thereto. A control circuit is provided to turn on the first transistor prior to the second transistor, and to turn on the second transistor if and only if the slew rate of the output signal of the first transistor is less or slower than a given value. With this arrangement, if there is a low total capacitance of the capacitance devices being driven, the first transistor will have a fast enough slew rate that it will perform the entire charging function of the devices without turning on the second transistor; however, if the total capacitance of the devices being charged is sufficiently large, the low slew rate of the first transistor will cause the second transistor to be turned on, thereby providing additional charging voltage to the capacitance devices, thus decreasing the time that would be required if only the first transistor were employed for the entire charging.

11 Claims, 3 Drawing Sheets

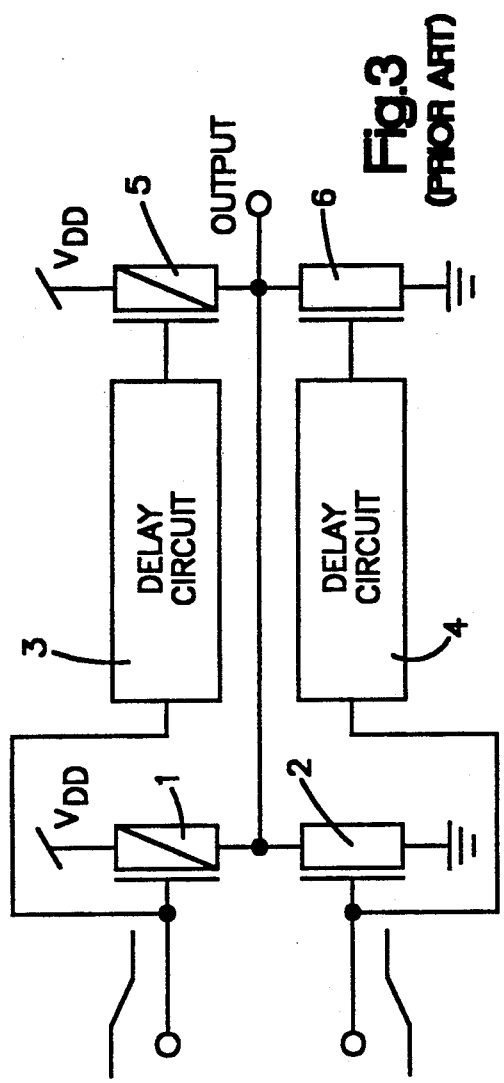
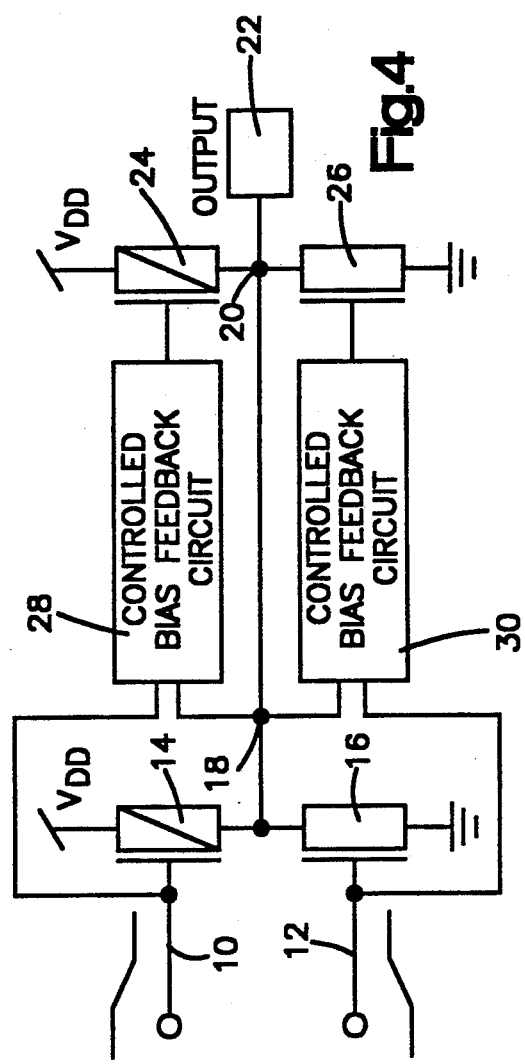
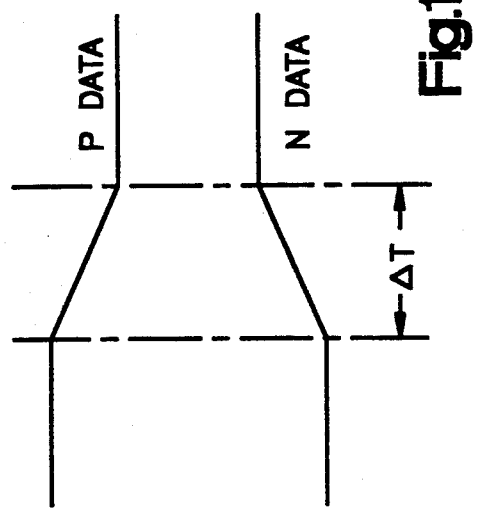
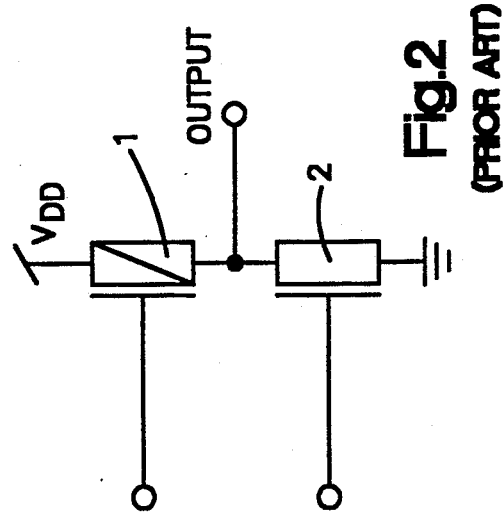

CMOS DRIVER CIRCUIT

BACKGROUND OF THE INVENTION

This invention relates generally to CMOS Driver Circuits, and more particularly to CMOS Driver Circuits which include a feedback arrangement which allows the driver circuit to drive transmission line networks and especially off-chip transmission line networks which may vary widely in their total capacitance and drive such loads rapidly even when there is a relatively large total capacitance, and without "ringing" or "reflections" when the total capacitance is relatively small.

There are many driver circuits which are designed to drive mainly capacitance loads, in particular off-chip capacitance devices, wherein the driver circuit must be able to handle a multiplicity of such devices having a wide range of total capacitance depending on what devices are being utilized in combination with the driver circuit. These particular driver circuits are typically designed in submicron CMOS Technology and a given driver circuit may be matched with any one of a number of different capacitance devices or arrays of such devices depending on the design and the end result desired. For example, a given driver circuit may be required to drive such devices which may have total capacitance ranging from as little as 10 picofarads ("pf's") to as much as 100 pf's, the same CMOS driver being required to handle this entire range of total capacitance of off-chip devices. If the CMOS driver circuit is designed to operate extremely rapidly in order to handle the 100 pf capacitance of the devices and it were attached to devices having a total capacitance of only 10 pf, a very rapid charging, or slew rate, (normally measured in volts per nanosecond), can result in a condition known as "reflections" or "ringing" which means the signal is difficult or impossible to detect, or alternatively a long time is required for the signal to stabilize so that it can be read. If on the other hand, the circuit is designed so as to avoid "ringing" when driving devices having total capacitance as low as 10 picofarads, then if it is connected to capacitance devices of 100 picofarads, the slew rate is so slow that it takes a long time to fully charge the devices which results in loss of the efficiency of the driver circuit.

It is therefore desirable to provide a circuit which will operate sufficiently rapidly when charging capacitance devices having a high total capacitance but still operate without "ringing" or "reflections" when charging devices having a relatively low total capacitance, and it is the principal object of the present invention to provide a CMOS driver circuit which operates in such a manner.

SUMMARY OF THE INVENTION

A CMOS integrated circuit for driving capacitance devices is provided. The circuit has an input node and an output node and includes a first transistor operatively connected to the input node and which is turned "on" and "off" by the input node to supply an output signal to the output node when turned "on", and a second transistor, the output of which is connected to the output node when turned "on" to supply an output signal thereto. Circuit means are provided to turn on the first transistor prior to the second transistor, and control bias feedback is provided to vary the amount of "turn on" of the second transistor in such a manner so as to achieve the desired output slew rate. With this arrangement, if there is a low total capacitance of the capacitance devices being driven, the first transistor will have a fast enough slew rate that it will perform the entire charging function of the devices without turning on the second transistor; however, if, on the other hand, the total capacitance of the devices being charged is sufficiently larger, the low slew rate of the first transistor will cause the second transistor to be turned on, thereby providing additional charging voltage to the capacitance devices, thus decreasing the time that would be required if only the first transistor were to do the entire charging.

DESCRIPTION OF THE DRAWINGS

FIG. 1 is a diagram of the "P" and "N" input data for a CMOS driver circuit;

FIG. 2 is one prior art embodiment of a driver circuit in CMOS technology;

FIG. 3 is another prior art embodiment of a driver circuit in CMOS technology;

FIG. 4 is a circuit diagram of a CMOS driver circuit according to this invention;

DESCRIPTION OF THE PREFERRED EMBODIMENT

Figure 7:
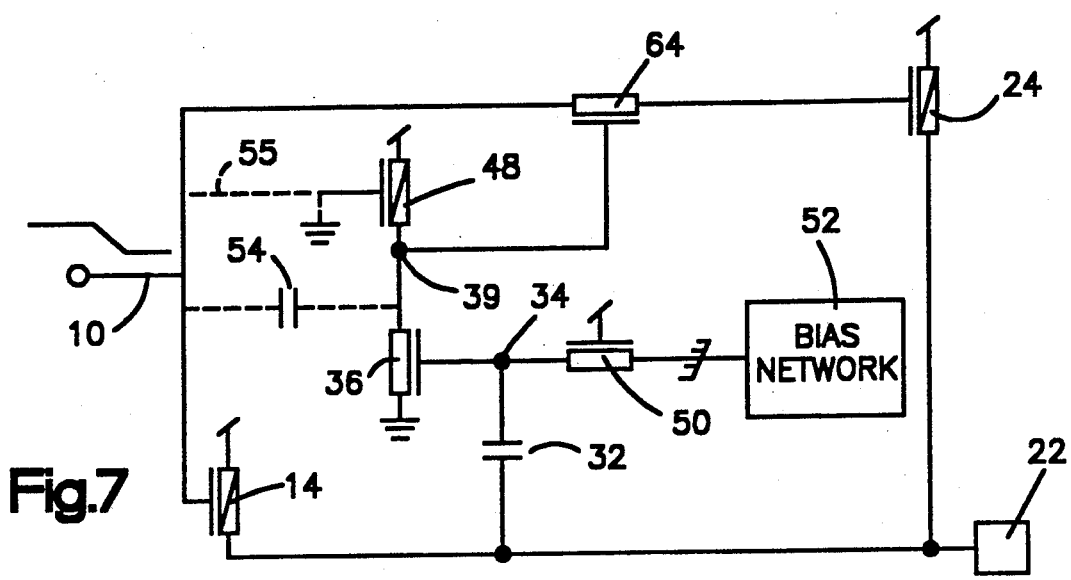
FIG. 7 is a circuit diagram of another embodiment of one of the delay portions of the circuit of FIG. 4.

Referring now to the drawing and to the present FIG. 1, a rise and fall curve for P data and N data lines in a CMOS circuit is shown. The P data line is normally high and the N data line is normally low. The T is the time of rise or fall of the signal on the lines which is used to control the rate of charging of a prior art CMOS circuit shown in FIG. 2. This circuit comprises a pair of transistors 1 and 2 which are turned on by either the N data or P data signal. FIG. 3 shows a CMOS circuit wherein a controlled delay is provided where transistors 1 or 2 are turned on immediately, and after a given time a delay circuit 3 or 4 turns on either transistor 5 or 6. The transistors 1 and 2 in FIG. 3 are small devices wherein transistors 6 and 5 are large and will turn on after a given period of time, irrespective of the action of transistors 1 and 2.

Referring now to FIG. 4, an improved driver circuit formed in submicron CMOS technology as a portion of an integrated circuit chip according to this invention is shown. The driver circuit is adapted to receive both a signal from a P data line 10 and a N data line 12. The P data line 10 is connected to the gate of transistor 14 and the N data line 12 is connected to the gate of transistor 16. The transistors 14 and 16 are tied together to supply an output signal to node 18 and to node 20, which node 20 in turn provides an output signal to charge a group of capacitance devices designated by the reference character 22. The number of capacitance devices 22 can vary and typically will be devices formed on a chip separate from the chip on which the driver circuit is formed; and, depending upon the particular use of the devices 22, the total capacitance may vary typically anywhere from about 10 pf's to about 100 pf's. It is this variation in total capacitance of the devices 22 that is compensated for by the driver circuit of the present invention.

The driver circuit also includes a pair of transistors 24 and 26 which are also connected to node 20. In this invention, either transistor 14 or 16 will charge the devices 22 if the total capacitance is low; but if the total capacitance is high, either transistors 14 and 24 together, or 16 and 26 together, charge the devices 22. In this particular device, which is known as a Tri-State Device, normally the P data line is up and the N data line is down. Only one of the transistors 14 or 16 is actuated. The driver device in this Tri-State device also can be turned off completely. This is well-known in the art and need not be described in detail herein.

The driver circuit also includes a controlled bias feedback circuit 28 operatively connected to transistor 24, and a control bias feedback circuit 30 operatively connected to transistor 26. The transistor 14 is a much weaker transistor than the transistor 24 and similarly transistor 16 is weaker than the transistor 26. In operation, when the P data or the N data line comes on, either one of the transistors 14 or 16 will be actuated. The description of the invention will be done by describing the actuation of the transistor 14 and the control bias feedback circuit 28, it being understood that the actuation of the transistor 16 and control bias feedback circuit 30 is similar and need not be described in detail.

Assuming the P data line actuates the transistor 14, this will cause the transistor 14 to actively charge the capacitance devices 22. If the total capacitance of the devices 22 is relatively low, e.g., 10 pf's, the slew rate, i.e., the volts/nanosecond as passed by the transistor 14 is relatively high and will quickly charge the capacitance devices 22. In this case the controlled bias feedback circuit 28, which will be described presently, is constructed such that it will prevent the transistor 24 from turning on, (transistor 24 normally being in the off stage) and hence transistor 24 will not contribute to the charging of the capacitance devices 22. If, on the other hand, there is a relatively large total capacitance of devices 22, e.g. 100 pf's, the slew rate of the transistor 14 in charging the devices 22 will be relatively slow, in which case the control bias feedback circuit 28 operates to fully turn on the transistor 24. The transistor 24, being a significantly stronger or faster transistor than the transistor 14, will then allow a much more rapid charging of the devices 22. Thus, if there is a relatively low total capacitance in the devices 22, transistor 14 being a relatively weaker and slower transistor can handle the entire charging which will not be fast enough to cause "ringing" or "reflections". If, on the other hand, the total capacitance of the devices 22 is relatively large, then the larger, more powerful transistor 24 is turned on which will cause the capacitance devices 22 to be charged up more rapidly than could be accomplished with transistor 14 alone; but since there is a much larger capacitance, the faster charging will not result in "ringing" or "reflections". On the other hand, if the transistor 24 were turned on to charge a low total capacitance of the devices 22, a "ringing" or "reflection" condition could result which would interfere with reading the signal.

Figure 5:
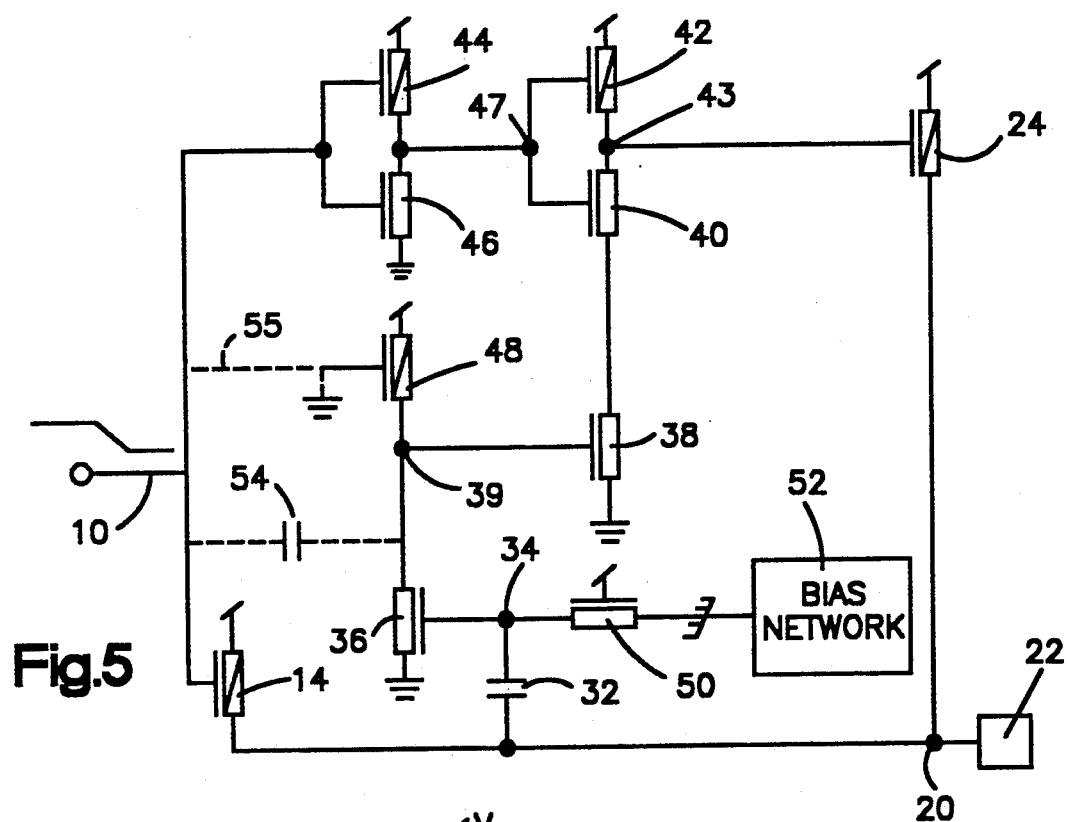
FIG. 5 is a circuit diagram of one embodiment of one of the controlled bias feedback circuits of the circuit at FIG. 4.
Figure 5A:
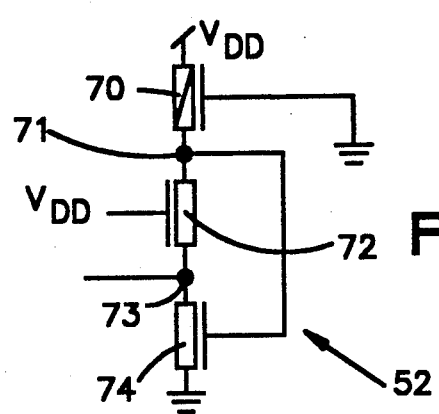
FIG. 5A is a circuit diagram of the bias network shown in FIG. 5.

Referring now to FIG. 5, the controlled bias feedback circuit 28 is shown in detail. This circuit includes a capacitor 32 connected between node 20 and node 34 which node 34 operates the gate of transistor 36, the output of which is connected to the gate of transistor 38 and to the output of transistor 48 through node 39. The output of transistor 38 is connected to transistor 40 which in turn is connected to transistor 42. Transistors 40 and 42 are tied together at node 43 to operate the gate of transistor 24. The gates of transistors 40 and 42 are tied together at node 47, which is connected between transistors 44 and 46. Transistors 44, 46, 42, and 40 constitute a double invertor acting as a buffer, the gates of transistors 44 and 46 being connected to the P data line 10. The circuit also includes a transistor 50 connected to a bias network 52. As shown in FIG. 5A, the bias network 52 comprises devices 70, 72, 74, and provides a DC current flow from Vdd to GND, such that node 71 is an N channel threshold above ground and tracks the threshold of device 36. Device 72 provides a slight voltage drop, so the voltage of node 73 is just slightly below the threshold of device 36. The voltage of node 73 is passed through device 50 to node 34. The gate of P channel device 70 can be switched between ground and Vdd instead of directly connected to ground so as to minimize power burn during inactive cycles. Referring back to FIG. 5, the circuit may contain a second capacitor 54 between nodes 10 and 39, or the gate of the transistor 48 can be connected to the P data line 10, as shown by broken line 55, rather than ground. These modifications vary the speed of the feedback operation of the circuit, as desired.

The following is a description of the operation of the controlled bias feedback circuit 28. The bias circuit 52 biases node 34, such that the voltage level is right at the edge of turning on the transistor 36 so that the action can quickly take place if the transistor 36 is to be turned on. Capacitor 32 connects the output node 20 to node 34. Transistor 50 is used as a resistance between node 34 and the bias circuit 52. When the P data line 10 is turned on, it will turn on transistor 14, which provides a voltage to node 20 of capacitor 32. If the voltage at node 20 rises slowly (less than the RC time constant of transistor 50 and capacitor 32), then the voltage at node 34 will maintain its level with the node 34 maintaining transistor 36 in its "off" condition. Node 39 is normally high, so, if transistor 36 is "off", node 39 stays high, leaving transistor 38, "on". Since the input data line 10 went from high to low, the connection of transistors 44 and 46 will cause node 47, which is normally negative, to go to positive, thus switching transistors 40 and 42, which will cause node 43 to go to ground, which will turn on the transistor 24; hence, a slow slew time of transistor 14, which represents a large capacitance of the devices 22, will cause transistor 24 to turn "on". Since transistor 24 is stronger than transistor 14, it will quickly charge the capacitance devices 22.

If, on the other hand, the output devices 22 are quickly charged up by the transistor 14, this causes a rapid rise of the voltage because of the rapid slew rate of the transistor 14, causing the capacitor 32 to transfer that rise to node 34. In this case, node 34 will change, which will turn "on" transistor 36. This will pull node 39 down, which in turn will turn "off" transistor 38, which in turn will prevent the transistors 40 and 42 from changing the state of node 43, which started high, and hence maintains the transistor 24 off, since the gate thereof is prevented from being turned on. Thus, in this case, where there is a rapid slew rate of transistor 14 in charging the devices 22, representing a relatively low total capacitance of devices 22, the entire charging is accomplished by the transistor 14, transistor 14 being of sufficient capacity to rapidly charge the devices 22. Thus, transistor 24 is turned "on" only if there is a large capacitance, which is determined by a slow slew rate of transistor 14 in charging the devices 22.

For capacitive loadings of devices 22 between a small capacitance (about 10 pf) and a large capacitance (about 100 pf) the operation is analog. That is, the voltage level of node 34 is determined by the RC time constant of transistor 50 and capacitor 32. This in turn sets a variable level of node 39 between Vdd and ground which varies the amount of drive on transistor 38, setting a variable voltage level on node 43 between Vdd and ground which varies the amount of drive (current capability) of transistor 24 keeping the voltage slew rate into devices 22 a constant.

Tuning of this circuit can be done, as indicated previously, by either adding capacitance 54, or changing the gate of transistor 48 from ground to the data line, to slow down the turn "on" of transistor 24. Also, the actuation of the circuit is such that it is preferred that the node 34 be adjusted, such that the voltage level is right at the edge of turning on the transistor 36 so that the action can quickly take place if the transistor 36 is to be turned on. This voltage is set by the bias network 52. This bias network is shown in FIG. 5A and its operation was described above. It will be noted that the transistors 44, 46, 42 and 40 provide a delay path for the signal that turns on transistor 24.

Under conditions where the respective load of devices 22 is small and transistor 24 is not used or only partially used to drive the output, after a controlled delay by device 50 and capacitor 32; node 34 regains its original bias level turning "off" transistor 36. This allows node 39 to rise, turning transistor 38 "on" allowing node 43 to go to ground turning "on" transistor 24 after the rise time of the output node 20 is complete. This provides a low impedance source to maintain the up level of the output for DC currents or AC uncoupling transients.

It is to be understood that the controlled bias feedback circuit 30 is similarly constructed to the controlled bias feedback circuit 28, and operates in the same manner when the N data line is actuated, and this need not be described in detail.

Figure 6:
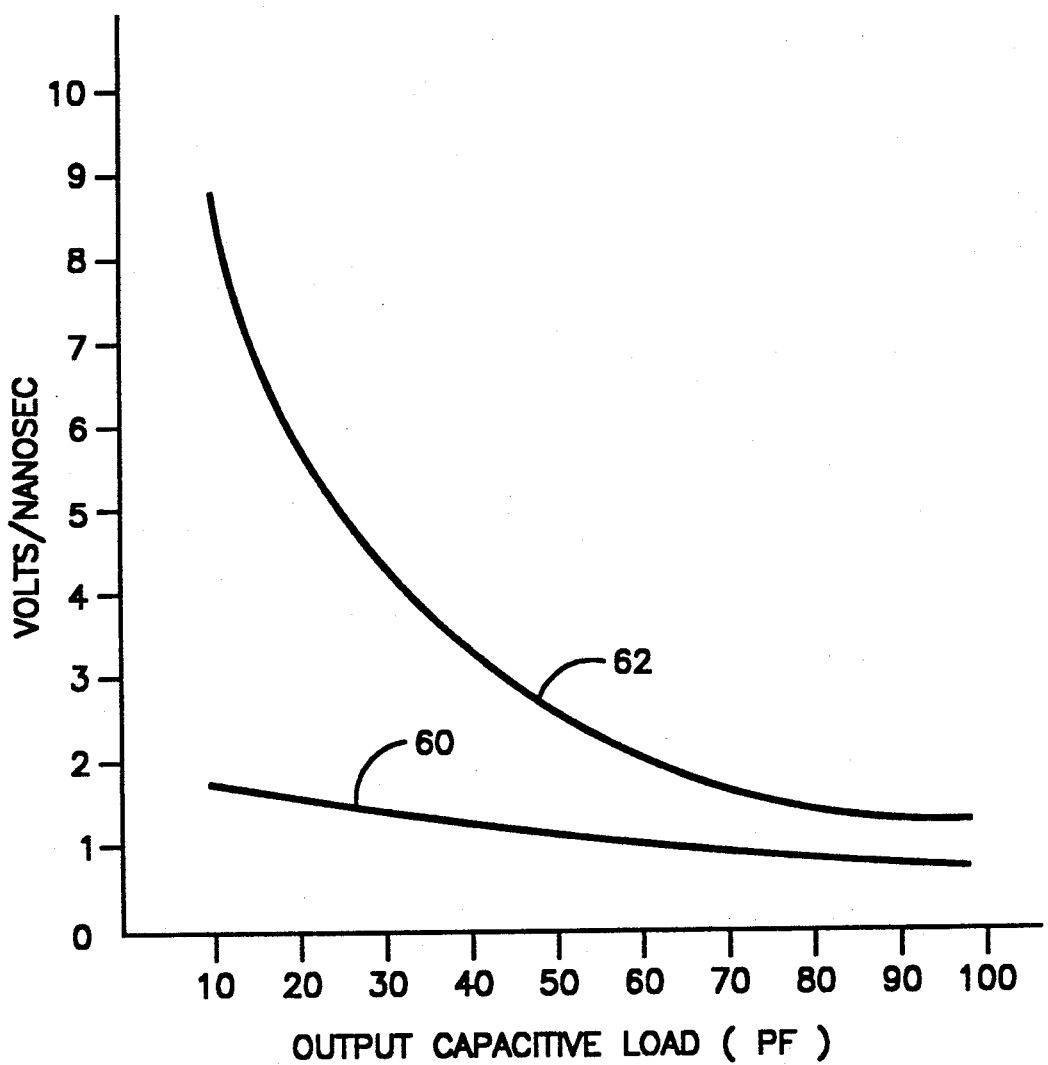
FIG. 6 is a graph comparing the slew rate of a circuit according to FIG. 6 with the slew rate of a circuit which does not have feed back.

FIG. 6 is a curve showing a graph of the output capacitance load (pf's) as a function of the slew rate, in volts per nanosecond. Curve 60 shows the operation of the circuit of the present invention and Curve 62 shows the operation of the circuit wherein the P-data is connected directly to the transistor 24 without feedback. It can be seen that the circuit of the present invention is a very flat curve, between only 1 and 2 volts per nanosecond for the entire range of 10 to 100 pf's, whereas without feedback the output volts per nanosecond ranges from about 8.5 to about 2 over this same range.

FIG. 7 shows a somewhat modified control circuit 28. In this embodiment, the output of transistors 36 and 48 are connected directly to the gate of transistor 64 which will turn on transistor 24. This circuit is a little more sensitive than the circuit in FIG. 5, but operates in a similar manner although being more sensitive and requires careful tuning.

While several embodiments of the invention have been shown and described, various adaptions and modifications can be made without departing from the scope of the invention as defined in the appended claims.

What is claimed is:

1. In a CMOS integrated circuit for driving capacitance devices, wherein said circuit includes an input node and an output node and comprising a first transistor operatively connected to the input node to be turned "on" and "off", and being coupled between a power supply and the output node to supply an output thereto when turned "on"; the improvement which comprises;
   a second transistor coupled between said power supply and the first output node to supply an output thereto when turned "on", first means operatively connected to both of said first and second transistors to turn said first transistor "on" prior to said second transistor, and controlled bias feedback means connected between said output node and said second transistor to turn said second transistor "on", if and only if the slew rate of the output signal of the first transistor is less than a given value.

2. The invention as defined in claim 1 wherein said controlled bias feedback means includes capacitor means operably coupled to said output node.

3. The invention as defined in claim 2 wherein said controlled bias feedback means includes a controlled bias feedback circuit means coupled to said output node through said capacitor means, said second transistor being operable in response to the charge rate of said capacitor.

4. The invention as defined in claim 1 wherein the slew rate of the signal of the second transistor is faster than the slew rate of the first transistor.

5. The invention as defined in claim 1 wherein said first means comprises a buffer circuit.

6. The invention as defined in claim 2 further characterized by second capacitor means interposed between said controlled bias feedback means and said input node.

7. The invention as defined in claim 2 wherein said controlled bias feedback means further comprises a third transistor operatively connected to said input node.

8. The invention as defined in claim 3 further characterized by a said controlled bias feedback means connected to turn on said second transistor after completion of output slew providing low impedance clamp to voltage supply.

9. A CMOS integrated circuit for driving capacitive loads, comprising
   first and second transistors of a first conductivity type, each being coupled between a first power supply node and an output node, said first and second transistors having control electrodes coupled to an input node,
   third and fourth transistors of a second conductivity type each being coupled between a second power supply node and the output node, said third and fourth transistors having control electrodes coupled to said input node,
   first and second buffer means coupled between said control electrodes of said second and fourth transistors, respectively, and said input node,
   first means coupled between said first buffer means and said output node, for providing operating voltage to said second transistor depending on the rate of change of the voltage on said output node; and
   second means coupled between said second buffer means and said output node, for providing operating voltage to said fourth transistor depending on the rate of change of the voltage on said output node.

10. A CMOS integrated circuit for driving capacitive loads, comprising, a first transistor having a control electrode coupled to an input node, and first and second controlled electrodes coupled to a first power supply and to an output node, respectively;

a buffer means coupled to said input means;

a second transistor having a control electrode coupled to said buffer means and first and second controlled electrodes coupled to said first power supply and to said output node, respectively;

a controlled bias feedback means coupled between said output node and said buffer means for operating said second transistor in response to the slew rate of an output voltage on the output node.

11. The invention as defined in claim 10, wherein said controlled bias feedback means comprises:

a capacitor having a first electrode coupled to said output node and a second node;

a resistor coupled to said second node;

a bias means coupled to said resistor for controlling the voltage on said second node;

a first control means coupled between said second node and said buffer means, and said first control means disabling said buffer means so as to turn on said second transistor if said output voltage has a slew rate sufficient to discharge said capacitor.

* * * * *